United States Patent
Ziomek et al.

(10) Patent No.: US 9,720,023 B2
(45) Date of Patent: Aug. 1, 2017

(54) VECTOR NETWORK POWER METER

(71) Applicant: Litepoint Corporation, Sunnyvale, CA (US)

(72) Inventors: Christopher Dennis Ziomek, Albuquerque, NM (US); Stephen Jachim, Albuquerque, NM (US)

(73) Assignee: LitePoint Corporation, Sunnyvale, CA (US)

( * ) Notice: Subject to any disclaimer, the term of this patent is extended or adjusted under 35 U.S.C. 154(b) by 52 days.

(21) Appl. No.: 14/270,672

(22) Filed: May 6, 2014

(65) Prior Publication Data

US 2014/0327429 A1 Nov. 6, 2014

Related U.S. Application Data

(60) Provisional application No. 61/820,085, filed on May 6, 2013, provisional application No. 61/856,659, filed on Jul. 20, 2013.

(51) Int. Cl.
*G01R 27/04* (2006.01)
*G01R 27/28* (2006.01)

(52) U.S. Cl.
CPC .................... *G01R 27/28* (2013.01)

(58) Field of Classification Search
CPC ........................................................ G01R 27/28
USPC ........................................................ 324/96
See application file for complete search history.

(56) References Cited

U.S. PATENT DOCUMENTS

| | | | |
|---|---|---|---|
| 5,715,183 A | 2/1998 | Grace et al. | |
| 6,529,844 B1* | 3/2003 | Kapetanic | G01R 23/20 |
| | | | 324/601 |
| 7,061,254 B1 | 6/2006 | Shoulders et al. | |
| 8,278,944 B1 | 10/2012 | Noujeim | |
| 2007/0159182 A1* | 7/2007 | Bradley | G01R 27/28 |
| | | | 324/638 |
| 2007/0259625 A1 | 11/2007 | Tolaio et al. | |
| 2010/0176789 A1 | 7/2010 | Zoughi et al. | |
| 2013/0106399 A1* | 5/2013 | Gohel | G01R 35/005 |
| | | | 324/76.77 |

OTHER PUBLICATIONS

International Search Report and Written Opinion in PCT/US2014/036924 issued on Sep. 2, 1014, 15 pages.

(Continued)

*Primary Examiner* — Tung X Nguyen
*Assistant Examiner* — Akm Zakaria
(74) *Attorney, Agent, or Firm* — Banner & Witcoff, Ltd.

(57) ABSTRACT

System and method for implementing a Vector Network Power Meter (VNPM) as a new class of electronic test instrument that uses a novel topology based upon a reflectometer to combine the functionality of a Power Meter with that of a Vector Network Analyzer (VNA). The VNPM overcomes application limitations of the two existing classes of test instruments, including parallel and simultaneous measurement capability, in-circuit operation, and improved accuracy and repeatability by eliminating the calibration of interconnecting cabling. Also provided are alternate implementations of a correlator for the reflectometer which reduce the size and complexity of the correlator while extending its frequency range without limit.

27 Claims, 7 Drawing Sheets

(56) References Cited

OTHER PUBLICATIONS

"The Six-Port Reflectometer: An Alternative Network Analyzer", IEEE Transactions on Microwave Theory and Techniques, vol, MTT-25, No. 12, Dec. 1977, Glenn F. Engen, Senior Member, IEEE, pp. 1075-1080.

""Thru-Reflect-Line": An Improved Technique for Calibrating the Dual Six-Port Automatic Network Analyzer", IEEE Transactions on Microwave Theory and Techniques, vol. MTT-27, No. 12, Dec. 1979, Glenn F. Engen, Senior Member, IEEE, and Cletus A. Hoer, Member, IEEE, pp. 987-993.

Anritsu Technical Data Sheet, VNA Master Handheld Vector Network Analyzer + Spectrum Analyzer, pp. 1-16.

International Preliminary Report on Patentability and Written Opinion of the International Searching Authority filed in PCT/US2014/036924; mailed Nov. 19, 2015; 12 pages.

\* cited by examiner

VECTOR NETWORK POWER METER

RELATED APPLICATIONS

This application claims priority to and the benefit of U.S. Patent Application 61/820,085, entitled "Vector Network Power Meter," which was filed on May 6, 2013, and U.S. Patent Application 61/856,659, entitled "Frequency Conversion Architecture," which was filed on Jul. 20, 2013, the disclosures of which are incorporated herein by reference.

BACKGROUND

The present invention relates to electronic test instrumentation, and in particular, to a Vector Network Power Meter (VNPM) as a new class of electronic test instrument that combines the functionality of a Power Meter with that of a Vector Network Analyzer (VNA) and is particularly useful for Radio Frequency (RF) test applications. The present invention further relates to frequency conversion architecture, and in particular, to frequency conversion architecture provided for wide frequency range signal correlation networks.

A Power Meter operates as a signal receiver and performs power level measurements with Power Meter instrument(s) attached to one or more output ports of the device under test (DUT). A conventional Power meter introduces measurement inaccuracy due to the mismatch or reflection of signals at the connection between the DUT and the Power Meter. Also, a conventional Power Meter acts as the endpoint or load for the measured signal and consequently does not allow simultaneous or parallel measurements upon a DUT output signal.

A VNA operates as a signal source and signal receiver to perform magnitude and phase measurements of transmission or reflection, also called scattering parameters (S-parameters). Measurements of S-parameters are currently performed with a VNA instrument attached to one or more input or output ports of the DUT. Existing VNAs calculate S-parameters in a controlled test setup where the VNA is calibrated and connected to the DUT with external cabling. The effects of that external cabling must be calibrated out as a separate step. Drift phenomenon such as temperature-related changes in the electrical length of the cabling can affect the VNA measurement accuracy. Also, the VNA performs S-parameter measurements in a controlled test setup that does not allow other simultaneous measurements upon the DUT signals.

Additionally, correlator networks are used in microwave signal processing to measure the relative amplitude, relative phase, or complex ratio of two signals. In particular, a six-port, or n-port, reflectometer incorporates such a correlator as part of its signal processing. A common implementation of a correlator network utilizes tuned microwave elements, such as quadrature couplers, to perform the necessary signal processing at the fundamental microwave measurement frequency. These tuned microwave elements are inherently limited in frequency range, and are commensurate in size with the wavelengths of the microwave signals being processed.

SUMMARY

In accordance with the presently claimed invention, a system and method are provided for implementing a Vector Network Power Meter (VNPM) as a new class of electronic test instrument that uses a novel topology based upon a reflectometer to combine the functionality of a Power Meter with that of a Vector Network Analyzer (VNA). The VNPM overcomes application limitations of the two existing classes of test instruments, including parallel and simultaneous measurement capability, in-circuit operation, and improved accuracy and repeatability by eliminating the calibration of interconnecting cabling. Also provided are alternate implementations of a correlator for the reflectometer which reduce the size and complexity of the correlator while extending its frequency range without limit.

In accordance with one embodiment of the presently claimed invention, a radio frequency (RF) vectorial signal measurement system includes:

reflectometer circuitry having a plurality of signal ports to receive a source signal, to convey to a load an incident signal related to said source signal and to receive from said load a reflection signal, and to provide a plurality of measurement signals related to said incident signal, said reflection signal, and one or more combinations of said incident signal and said reflection signal; and conversion circuitry coupled to said reflectometer circuitry and responsive to at least a portion of said plurality of measurement signals by providing a plurality of conversion signals indicative of respective magnitudes of said plurality of measurement signals.

In accordance with another embodiment of the presently claimed invention, a method for performing radio frequency (RF) vectorial signal measurements includes:

receiving, via one of a plurality of signal ports of reflectometer circuitry, a source signal;

providing, to a load via another of said plurality of signal ports of said reflectometer circuitry, an incident signal related to said source signal;

receiving, from said load via said another of said plurality of signal ports, a reflection signal;

providing, via further ones of said plurality of signal ports of said reflectometer circuitry, a plurality of measurement signals related to said incident signal, said reflection signal, and one or more combinations of said incident signal and said reflection signal; and converting at least a portion of said plurality of measurement signals to a plurality of conversion signals indicative of respective magnitudes of said plurality of measurement signals In accordance with another embodiment of the presently claimed invention, a radio frequency (RF) vectorial signal measurement system includes:

reflectometer means for receiving a source signal, providing to a load an incident signal related to said source signal, receiving from said load a reflection signal, and providing a plurality of measurement signals related to said incident signal, said reflection signal, and one or more combinations of said incident signal and said reflection signal; and conversion means for responding to at least a portion of said plurality of measurement signals by providing a plurality of conversion signals indicative of respective magnitudes of said plurality of measurement signals.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, to the extent that the figures illustrate diagrams of the functional blocks of various embodiments, the functional blocks are not necessarily indicative of the division between hardware circuitry.

Figure 1:
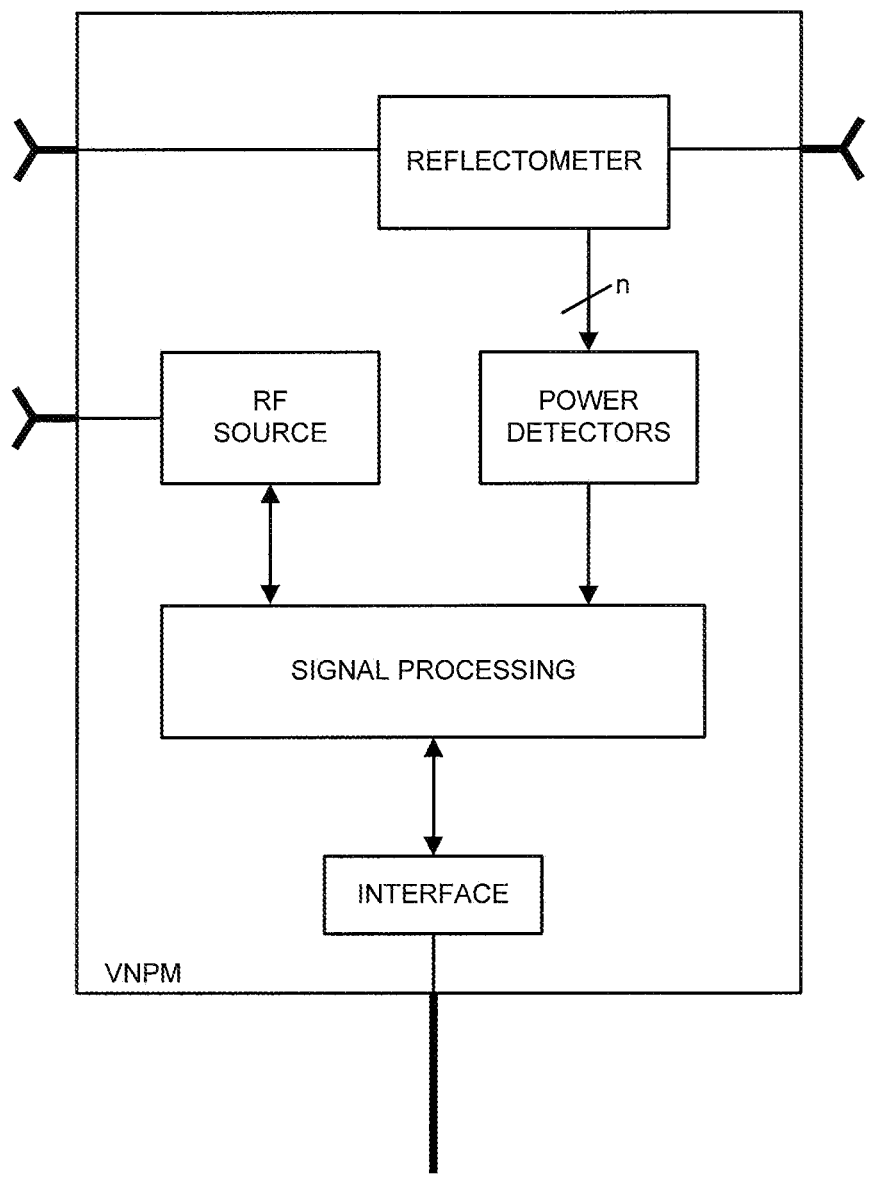
FIG. 1 depicts a topology of a VNPM in accordance with exemplary embodiments of the presently claimed invention.

Referring to FIG. 1, in accordance with exemplary embodiments, a basic block diagram topology of one of the VNPM includes: a reflectometer with input and output ports for connections to external test signals, and one or more internal signals used for signal processing; one or more Power Detectors for measuring the internal reflectometer signals; an RF Source used to generate an output calibration or test signal; a Signal Processing block used to perform computations such as measurements, error correction and scaling; and an Interface block that is used to send command and data information to/from an external computer or human interface device.

Figure 2:
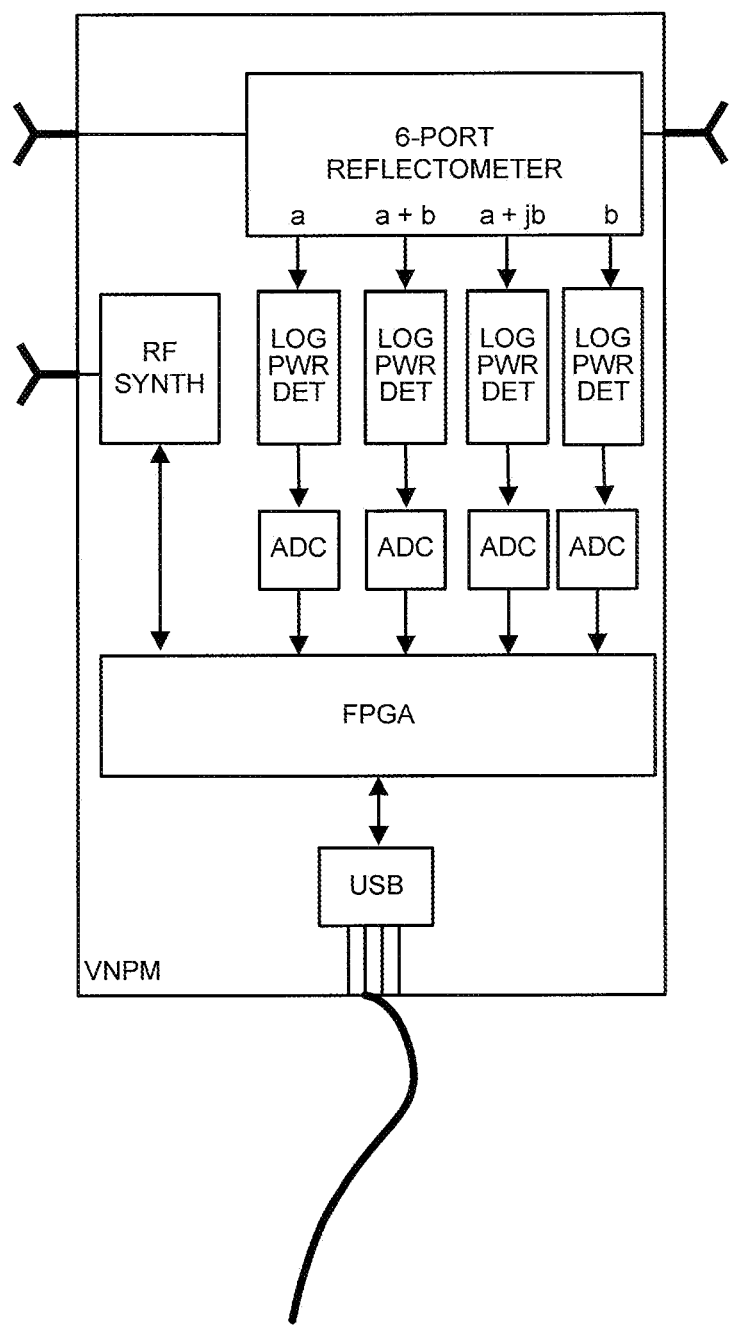
FIG. 2 depicts an implementation of a VNPM in accordance with exemplary embodiments of the presently claimed invention.

Referring to FIG. 2, in accordance with exemplary embodiments, a more specific implementation of the VNPM based upon the basic topology of FIG. 1 uses a six-port reflectometer to create four output signals (a, b, a+b, a+jb) that are processed in logarithmic magnitude detectors, and then converted to digital data in Analog-to-Digital Converters (ADC). The four signals created by the six-port reflectometer network enable computation of the magnitude and phase of the incident and reflected waves propagating through the reflectometer, using calibration, error-correction and other known signal processing techniques. In this implementation, those signal processing functions are performed by digital signal processing functionality within a Field Programmable Gate Array (FPGA). A control and data interface is provided using a Universal Serial Bus (USB) interface. A Synthesizer block provides a RF signal source that generates a local signal with desired frequencies and power levels for testing or calibration.

In order to optimize performance, the VNPM may also include additional functionality, such as envelope triggering for pulsed signals, temperature monitoring and compensation, frequency-dependent calibration tables (e.g., in volatile or non-volatile memory), external trigger input and/or output connections, or phase or time reference signal connections for multiple-VNPM S-parameter phase measurements.

Figure 3:
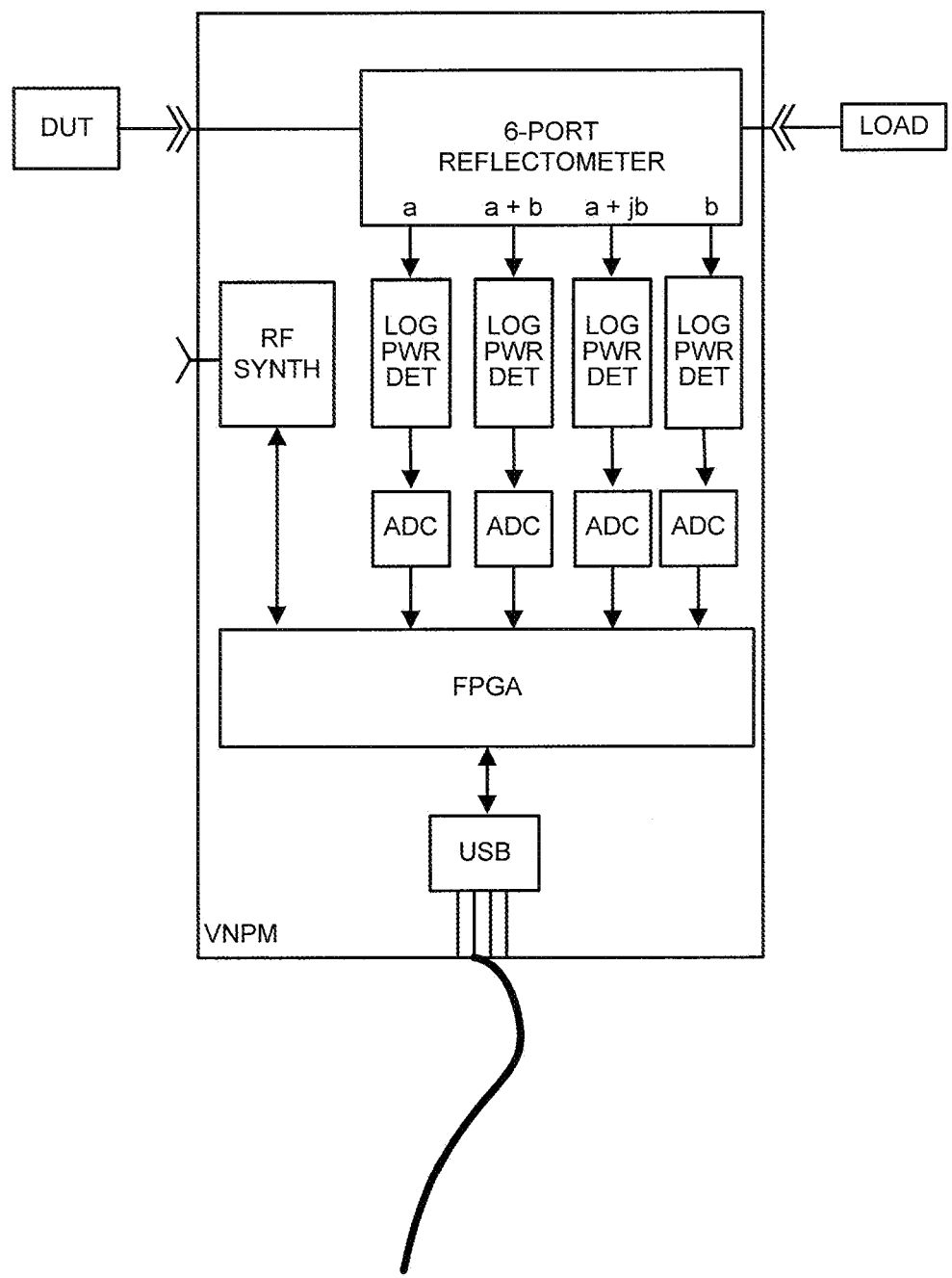
FIG. 3 depicts a VNPM used as power meter in accordance with exemplary embodiments of the presently claimed invention.
Figure 4:
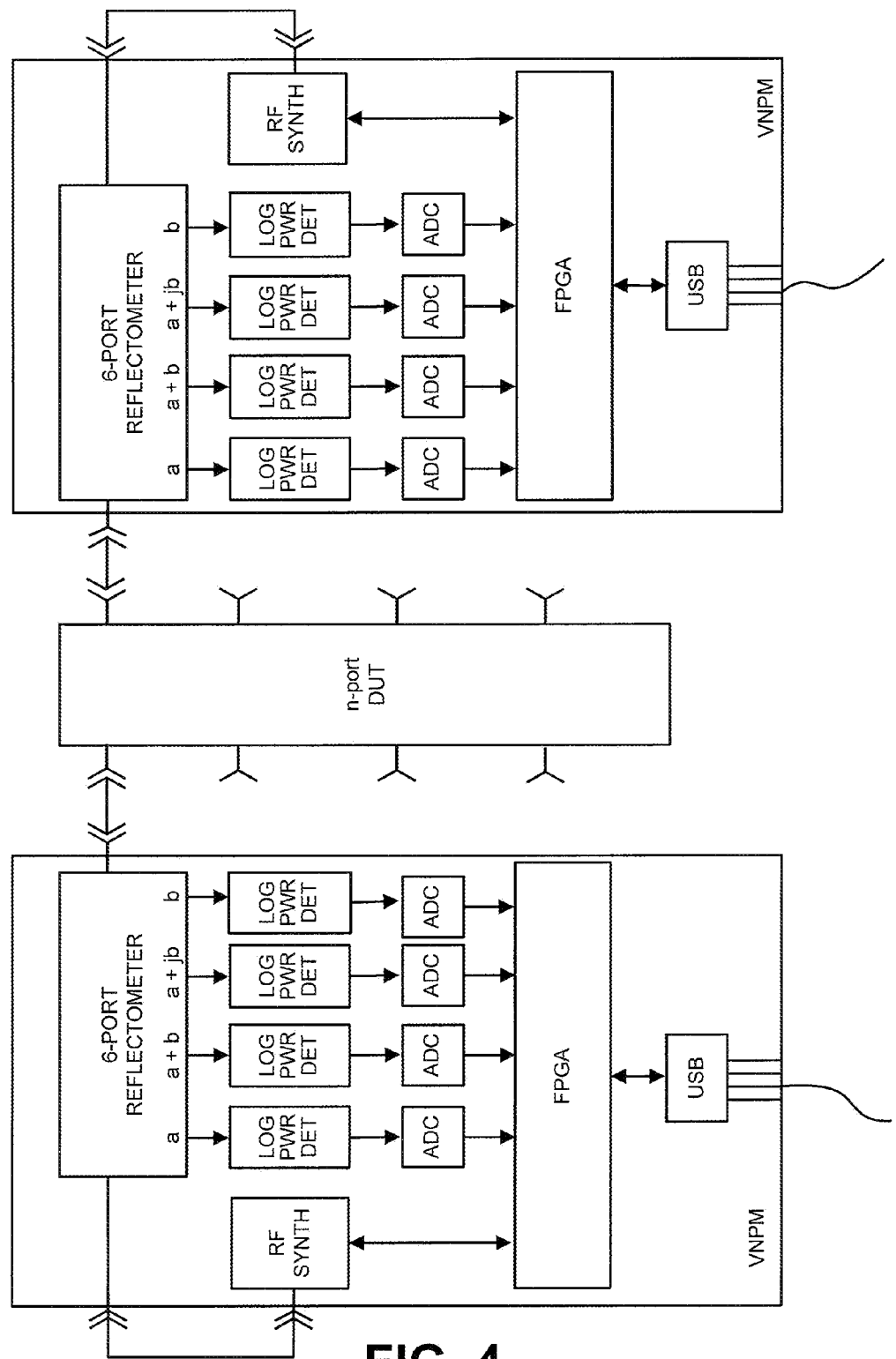
FIG. 4 depicts a VNPM used as a multi-port VNA in accordance with exemplary embodiments of the presently claimed invention.
Figure 5:
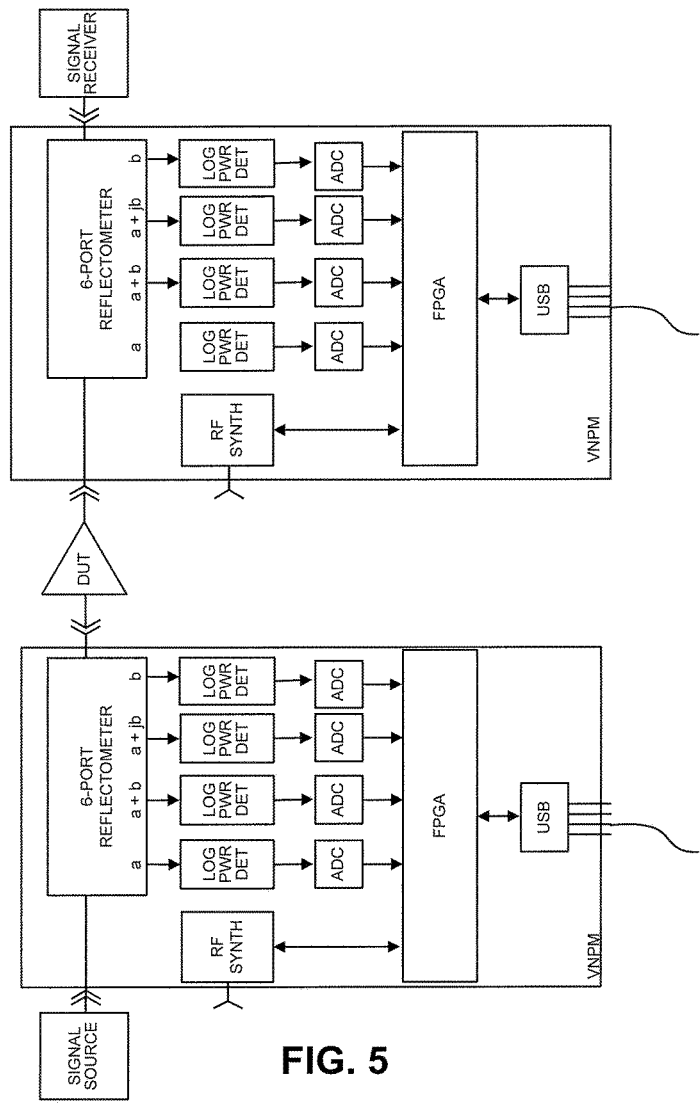
FIG. 5 depicts a VNPM used in-circuit as a combined power meter and VNA in accordance with exemplary embodiments of the presently claimed invention.

Referring to FIGS. 3-5, it will be readily appreciated from the foregoing discussion that exemplary applications (among others) for the VNPM include use as a Power Meter (FIG. 3), use as a multi-port VNA (FIG. 4), and use as an in-circuit combination Power Meter and VNA (FIG. 5).

Referring to FIG. 3, in a Power Meter application the VNPM monitors and measures the power level of the output signal from the DUT. A load is placed on the secondary port of the VNPM to absorb the RF signal. Error-correction techniques consistent with six-port reflectometer network calibration can be used to correct for coupler directivity and signal reflections (e.g., due to an impedance mismatch) at the load.

Referring to FIG. 4, in a multi-port VNA application one or more VNPMs are connected to one or more test ports on the DUT (e.g., two such port connections). On each VNPM, the on-instrument signal source is looped back to the primary port of the VNPM as the test signal source. The VNPM topology enables the calibration plane for the VNA S-parameter measurements at the secondary port connector, thereby eliminating interconnection cabling and allowing factory calibration to be used in most applications. Full vector reflection measurements (magnitude and phase) can be performed at each port. Scalar transmission measurements (magnitude-only) from any one port to any other can be performed. Full vector transmission measurements (magnitude and phase) from any one port to any other can be performed by distributing a phase reference signal to each VNPM.

Referring to FIG. 5, in an in-circuit application the VNPM acts as both a Power Meter and VNA. In this application, the VNPM does not use its on-instrument (e.g., internal) signal source, but instead passively monitors the test signal being applied by other test equipment performing other measurements or tests in parallel. Power measurements can be made for any type of signal such as continuous-wave (CW) signals, pulsed signals, single-frequency signals, modulated signals, or multi-tone signals. Full vector VNA S-parameter measurements (magnitude and phase) can be made for CW single-frequency signals using the same techniques described previously for multi-port VNA measurements. In this situation where the VNPM does not generate the test signal, the signal frequency used for error-correction can be entered via the command interface.

Based upon the foregoing discussion, it will be appreciated that a VNPM in accordance with exemplary embodiments of the presently claimed invention advantageously enables many features and capabilities. For example, an electronic test instrument is provided that combines Power Meter and Vector Network Analyzer measurement functionality into a single instrument based upon a reflectometer. Such combined instrument functionality reduces test time by making two different classes of measurements in parallel, and reduces test equipment costs by combining two classes of instruments into one. The novel reflectometer topology enables in-circuit vector network measurements in an actual circuit, system or device, without test points or external cabling which require calibration and introduce measurement uncertainty. Such in-circuit measurement capabilities enable the instrument to be located at the DUT, thereby simplifying the test setup and calibration requirements, and providing more accurate measurements. Such in-circuit measurement capabilities further enable the instrument to be located at the DUT for Power Meter and VNA measurements during automated test applications by placing the instrument onto a test fixture such as a load board or probe card, as well as provide a more accurate power measurement by separating and correcting for the incident versus reflected signals propagating in the circuit.

Further, applying mismatch error-correction to such an instrument enables higher accuracy power measurements that negate errors caused by signal reflections from the load, as would otherwise be experienced with conventional Power Meters. Also, the remote VNA measurement capabilities enable the instrument to be located at the DUT to provide the calibration plane for the S-parameter measurements at the instrument connection instead of at the end of a calibrated cable, as would otherwise be required with conventional VNAs. The remote VNA measurement capabilities further enable the calibration process for the instrument to be eliminated or greatly simplified because factory calibration can be used for most applications, due to the elimination of interconnecting cables, as well as eliminate uncertainty introduced by interconnecting cabling, such as temperature variations in the electrical length of the cables.

Further enabled is the ability of the instrument to operate in both CW and pulsed signal modes for VNA S-parameter measurements. For DUTs that may have performance changes related to a pulsed mode of operation, this ability to make VNA S-parameter measurements in the actual pulsed use case may provide a more realistic and accurate measurement of the DUT S-parameters. Also enabled is the ability of the instrument to make S-parameter measurements as a passive monitoring instrument by using a separate external test signal source.

Figure 6:
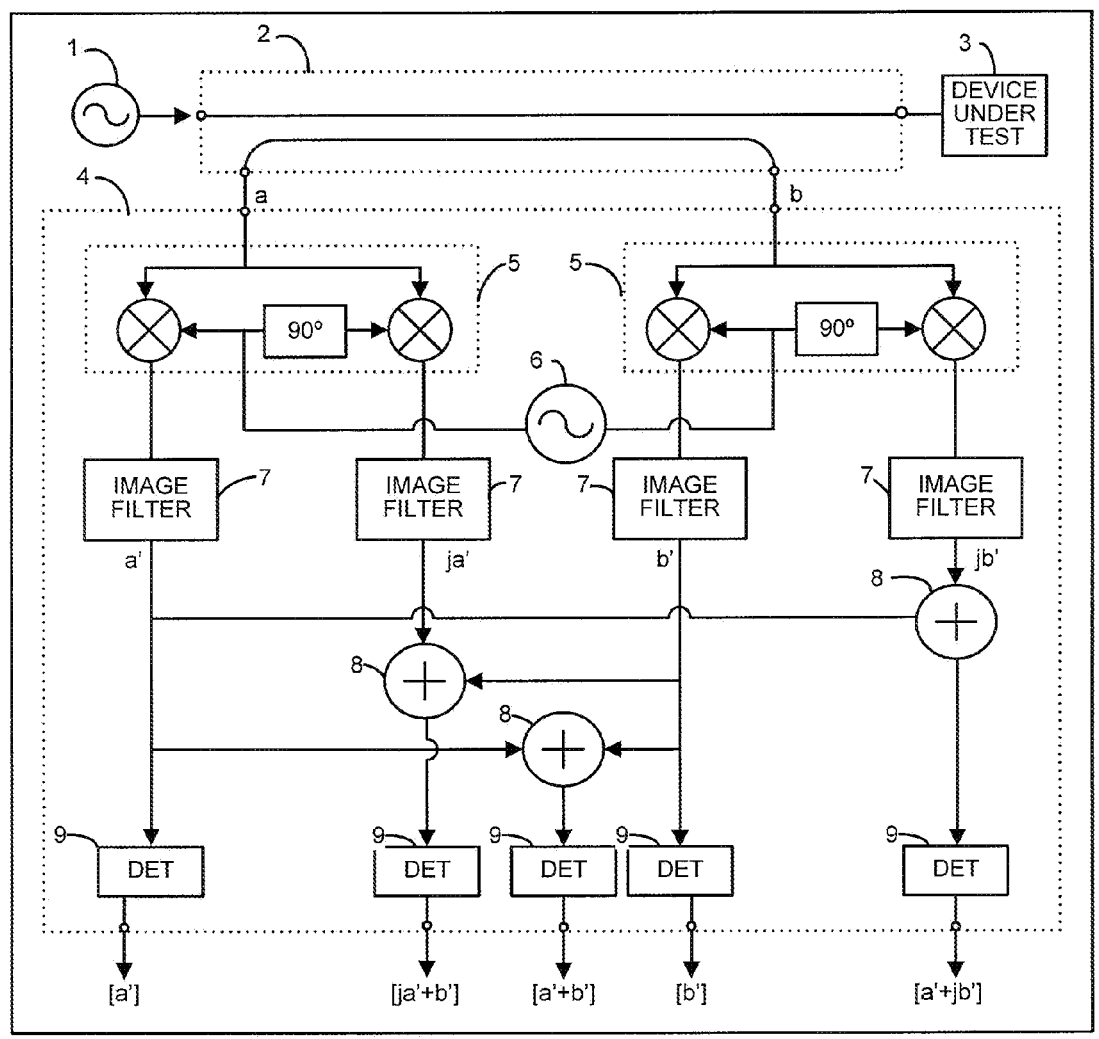
FIG. 6 depicts a schematic of a seven-port reflectometer system using real-valued IF signals in accordance with exemplary embodiments of the presently claimed invention.

Referring to FIG. 6, in accordance with exemplary embodiments, a seven-port reflectometer system is connected to a signal source (1) and a DUT (3) via a coupler (2) which samples the forward and reverse traveling waves flowing between the source and DUT. The wave samples (a, b) are applied to a correlator network (4) for signal processing. (As will be readily appreciated, this discussion is not limited to a seven-port reflectometer, but is applicable to any microwave correlator function.)

This exemplary implementation of the subject correlator (4) coherently converts (5) the fundamental wave samples (a, b) to real-valued signals at a convenient intermediate frequency (IF), using a local oscillator (6). The coherent conversion is performed with both in-phase (I) and quadrature-phase (Q) versions of the local oscillator (6), thereby producing both in-phase and quadrature-phase versions of the sampled waves at the sum and difference of the signal source (1) and local oscillator (6) frequencies. Image filters (7) suppress the unwanted difference or sum frequency components of the IF signal, resulting in frequency and phase shifted replicas of the sampled wave signals (a', b', ja', jb') at the desired IF.

Signal combiners (8) perform the vectorial addition of the sampled wave replicas required by the correlator process. The amplitudes of the correlator output signals are measured in amplitude by power detectors (9), and can be used to compute the desired function of the wave samples (a, b).

Figure 7:
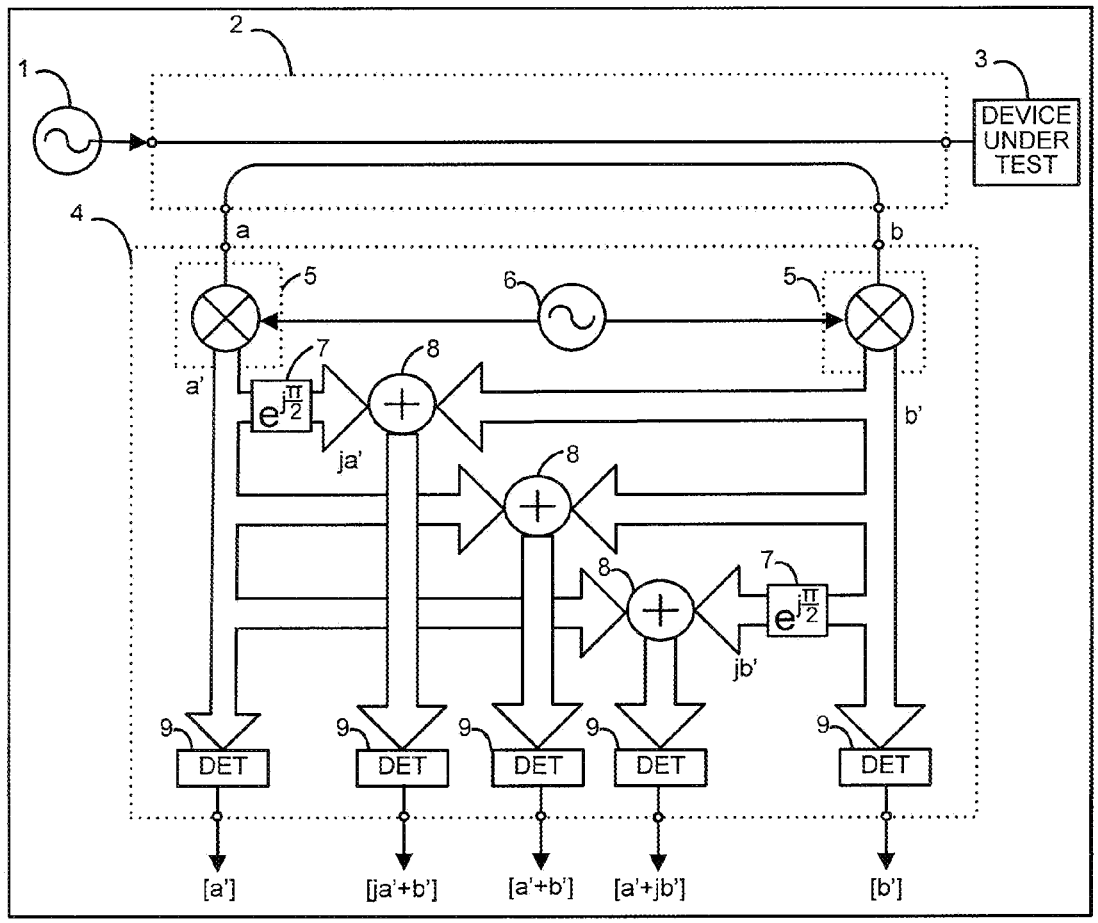
FIG. 7 depicts a schematic of a seven-port reflectometer system using complex-valued IF signals in accordance with exemplary embodiments of the presently claimed invention.

Referring to FIG. 7, in accordance with exemplary embodiments, a seven-port reflectometer system is connected to a signal source (1) and a DUT (3) via a coupler (2) which samples the forward and reverse traveling waves flowing between the source and DUT. The wave samples (a, b) are applied to a correlator network (4) for signal processing. (As will be readily appreciated, this discussion is not limited to a seven-port reflectometer, but is applicable to any microwave correlator function.)

This exemplary implementation of the subject correlator (4) coherently converts (5) the fundamental wave samples (a, b) to complex-valued signals at a convenient intermediate frequency (IF), using a local oscillator (6). The coherent conversion is performed with image-rejecting mixers driven by the local oscillator (6), thereby producing complex-valued versions of the sampled waves (a', b') at either the sum or difference of the signal source (1) and local oscillator (6) frequencies.

This approach eliminates the need for image filters to suppress the unwanted difference or sum frequency components of the IF signal, and results in single-sideband replicas of the wave samples at the desired IF.

Complex phase shifters (7) and signal combiners (8) perform the vectorial addition of the sampled wave replicas required by the correlator process. The amplitudes of the correlator output signals are measured in amplitude by power detectors (9), and can be used to compute the desired function of the wave samples (a, b).

Various other modifications and alterations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a radio frequency (RF) vectorial signal measurement system, comprising:
reflectometer circuitry having a plurality of signal ports to receive a source signal, to convey to a load an incident signal related to said source signal and to receive from said load a reflection signal, and to provide a plurality of measurement signals related to said incident signal, said reflection signal, and one or more combinations of said incident and reflection signals together, wherein said plurality of signal ports includes
a source signal port to receive said source signal,
a load signal port to convey to said load said incident signal and to receive from said load said reflection signal,
a first signal port to provide a first measurement signal related to said incident signal,
a second signal port to provide a second measurement signal related to said reflection signal, a third signal port to provide a third measurement signal related to a sum of said incident signal and said reflection signal, and a fourth signal port to provide a fourth measurement signal related to another sum of said incident signal and said reflection signal, and said reflectometer circuitry further includes first frequency conversion circuitry responsive to a local RF signal and said incident signal by providing said first measurement signal and a corresponding first orthogonal signal with mutually common lower frequencies than and corresponding to said incident signal, and second frequency conversion circuitry responsive to said local RF signal and said reflection signal by providing said second measurement signal and a corresponding second orthogonal signal with mutually common lower frequencies than and corresponding to said reflection signal; and conversion circuitry coupled to said reflectometer circuitry and responsive to at least a portion of said plurality of measurement signals by providing a plurality of conversion signals indicative of respective magnitudes of said plurality of measurement signals, wherein said conversion circuitry is responsive to at least said first, second, third and fourth measurement signals by providing at least first, second, third and fourth conversion signals indicative of first, second, third and fourth magnitudes of said first, second, third and fourth measurement signals, respectively.

2. The apparatus of claim 1, wherein:

said third measurement signal comprises a sum of said incident signal and said reflection signal; and said fourth measurement signal comprises a sum of said incident signal and a signal corresponding to and orthogonal to said reflection signal.

3. The apparatus of claim 1, wherein:

said third measurement signal comprises a sum of said incident signal and said reflection signal; and said fourth measurement signal comprises a sum of said reflection signal and a signal corresponding to and orthogonal to said incident signal.

4. The apparatus of claim 1, wherein:

said third measurement signal comprises a sum of said first measurement signal and said second measurement signal; and said fourth measurement signal comprises a sum of said first measurement signal and a signal corresponding to and orthogonal to said second measurement signal.

5. The apparatus of claim 1, wherein:

said third measurement signal comprises a sum of said first measurement signal and said second measurement signal; and said fourth measurement signal comprises a sum of said second measurement signal and a signal corresponding to and orthogonal to said first measurement signal.

6. The apparatus of claim 1, wherein said reflectometer circuitry further includes:

first frequency conversion circuitry responsive to a local RF signal and said incident signal by providing at least said first measurement signal with a lower frequency than and corresponding to said incident signal; and second frequency conversion circuitry responsive to said local RF signal and said reflection signal by providing at least said second measurement signal with a lower frequency than and corresponding to said reflection signal.

7. The apparatus of claim 6, wherein said reflectometer circuitry further includes:

first signal combining circuitry coupled to said first and second frequency conversion circuitries, and responsive to said first and second measurement signals by providing said third measurement signal; and second signal combining circuitry coupled to said first and second frequency conversion circuitries, and responsive to a portion of said at least said first measurement signal and a portion of said at least said second measurement signal by providing said fourth measurement signal.

8. The apparatus of claim 7, wherein said reflectometer circuitry further includes:

a fifth signal port to provide a fifth measurement signal related to still another sum of said incident signal and said reflection signal; and third signal combining circuitry coupled to said first and second frequency conversion circuitries, and responsive to said portion of said at least said first measurement signal and another portion of said at least said second measurement signal, or another portion of said at least said first measurement signal and said portion of said at least said second measurement signal, by providing said fifth measurement signal.

9. The apparatus of claim 1, wherein said reflectometer circuitry further includes:

first signal combining circuitry coupled to said first and second frequency conversion circuitries, and responsive to said first and second measurement signals by providing said third measurement signal; and second signal combining circuitry coupled to said first and second frequency conversion circuitries, and responsive to said first measurement signal and said second measurement signal by providing said fourth measurement signal.

10. The apparatus of claim 9, wherein said reflectometer circuitry further includes:

a fifth signal port to provide a fifth measurement signal related to still another sum of said incident signal and said reflection signal; and third signal combining circuitry coupled to said first and second frequency conversion circuitries, and responsive to said first measurement signal and said second orthogonal signal, or said first orthogonal signal and said second measurement signal, by providing said fifth measurement signal.

11. The apparatus of claim 1, wherein said conversion circuitry comprises RF signal power detection circuitry.

12. The apparatus of claim 1, further comprising processing circuitry coupled to said conversion circuitry and responsive to said first, second, third and fourth conversion signals by providing one or more data signals indicative of one or more of:

a magnitude of said incident signal;

a phase of said incident signal;

a magnitude of said reflection signal; or a phase of said reflection signal.

13. The apparatus of claim 12, wherein said processing circuitry comprises a field programmable gate array.

14. The apparatus of claim 1, further comprising:
a RF signal source to provide a local RF signal; and
processing circuitry coupled to said conversion circuitry and said RF signal source, and responsive to said first, second, third and fourth conversion signals and said local RF signal by providing one or more data signals indicative of one or more of
a magnitude of said incident signal,
a phase of said incident signal,
a magnitude of said reflection signal, or
a phase of said reflection signal.

15. The apparatus of claim 1, wherein said reflectometer circuitry further includes a fifth signal port to provide a fifth measurement signal related to still another sum of said incident signal and said reflection signal.

16. The apparatus of claim 15, wherein:
said third measurement signal comprises a sum of said incident signal and said reflection signal;
said fourth measurement signal comprises a sum of said incident signal and a signal corresponding to and orthogonal to said reflection signal; and
said fifth measurement signal comprises a sum of said reflection signal and a signal corresponding to and orthogonal to said incident signal.

17. The apparatus of claim 15, wherein:
said third measurement signal comprises a sum of said first measurement signal and said second measurement signal;
said fourth measurement signal comprises a sum of said first measurement signal and a signal corresponding to and orthogonal to said second measurement signal; and
said fifth measurement signal comprises a sum of said second measurement signal and a signal corresponding to and orthogonal to said first measurement signal.

18. A method for performing radio frequency (RF) vectorial signal measurements, comprising:
receiving, via one of a plurality of signal ports of reflectometer circuitry, a source signal;
providing, to a load via another of said plurality of signal ports of said reflectometer circuitry, an incident signal related to said source signal;
receiving, from said load via said another of said plurality of signal ports, a reflection signal;
providing, via further ones of said plurality of signal ports of said reflectometer circuitry, a plurality of measurement signals related to said incident signal, said reflection signal, and one or more combinations of said incident and reflection signals together, including
providing, via a first signal port of said reflectometer circuitry, a first measurement signal related to said incident signal,
providing, via a second signal port of said reflectometer circuitry, a second measurement signal related to said reflection signal,
providing, via a third signal port of said reflectometer circuitry, a third measurement signal related to a sum of said incident signal and said reflection signal,
providing, via a fourth signal port of said reflectometer circuitry, a fourth measurement signal related to another sum of said incident signal and said reflection signal,
responding to a local RF signal and said incident signal by providing said first measurement signal and a corresponding first orthogonal signal with mutually common lower frequencies than and corresponding to said incident signal, and
responding to said local RF signal and said reflection signal by providing said second measurement signal and a corresponding second orthogonal signal with mutually common lower frequencies than and corresponding to said reflection signal; and
converting at least a portion of said plurality of measurement signals to a plurality of conversion signals indicative of respective magnitudes of said plurality of measurement signals, including converting at least said first, second, third and fourth measurement signals to at least first, second, third and fourth conversion signals indicative of first, second, third and fourth magnitudes of said first, second, third and fourth measurement signals, respectively.

19. The method of claim 18, wherein:
said providing a third measurement signal comprises combining said incident signal and said reflection signal; and
said providing a fourth measurement signal comprises combining said incident signal and a signal corresponding to and orthogonal to said reflection signal.

20. The method of claim 18, wherein:
said providing a third measurement signal comprises combining said incident signal and said reflection signal; and
said providing a fourth measurement signal comprises combining said reflection signal and a signal corresponding to and orthogonal to said incident signal.

21. The method of claim 18, wherein:
said providing a third measurement signal comprises combining said first measurement signal and said second measurement signal; and
said providing a fourth measurement signal comprises combining said first measurement signal and a signal corresponding to and orthogonal to said second measurement signal.

22. The method of claim 18, wherein:
said providing a third measurement signal comprises combining said first measurement signal and said second measurement signal; and
said providing a fourth measurement signal comprises combining said second measurement signal and a signal corresponding to and orthogonal to said first measurement signal.

23. An apparatus including a radio frequency (RF) vectorial signal measurement system, comprising:
reflectometer means for
receiving a source signal,
providing to a load an incident signal related to said source signal,
receiving from said load a reflection signal, and
providing a plurality of measurement signals related to said incident signal, said reflection signal, and one or more combinations of said incident and reflection signals together, including
providing a first measurement signal related to said incident signal,
providing a second measurement signal related to said reflection signal,
providing a third measurement signal related to a sum of said incident signal and said reflection signal,
providing a fourth measurement signal related to another sum of said incident signal and said reflection signal,
responding to a local RF signal and said incident signal by providing said first measurement signal and a corresponding first orthogonal signal with mutually common lower frequencies than and corresponding to said incident signal, and responding to said local RF signal and said reflection signal by providing said second measurement signal and a corresponding second orthogonal signal with mutually common lower frequencies than and corresponding to said reflection signal; and conversion means for responding to at least a portion of said plurality of measurement signals by providing a plurality of conversion signals indicative of respective magnitudes of said plurality of measurement signals, including responding to at least said first, second, third and fourth measurement signals by providing at least first, second, third and fourth conversion signals indicative of first, second, third and fourth magnitudes of said first, second, third and fourth measurement signals, respectively.

24. The apparatus of claim 23, wherein:

said providing a third measurement signal comprises combining said incident signal and said reflection signal; and said providing a fourth measurement signal comprises combining said incident signal and a signal corresponding to and orthogonal to said reflection signal.

25. The apparatus of claim 23, wherein:

said providing a third measurement signal comprises combining said incident signal and said reflection signal; and said providing a fourth measurement signal comprises combining said reflection signal and a signal corresponding to and orthogonal to said incident signal.

26. The apparatus of claim 23, wherein:

said providing a third measurement signal comprises combining said first measurement signal and said second measurement signal; and said providing a fourth measurement signal comprises combining said first measurement signal and a signal corresponding to and orthogonal to said second measurement signal.

27. The apparatus of claim 23, wherein:

said providing a third measurement signal comprises combining said first measurement signal and said second measurement signal; and said providing a fourth measurement signal comprises combining said second measurement signal and a signal corresponding to and orthogonal to said first measurement signal.

* * * * *